United States Patent
Becker et al.

(10) Patent No.: US 7,269,777 B2
(45) Date of Patent: Sep. 11, 2007

(54) DECODING APPARATUS, TRELLIS PROCESSOR, AND METHOD FOR OPERATING THE DECODER

(75) Inventors: Burkhard Becker, Ismaning (DE); Jens Berkmann, München (DE); Thomas Herndl, Biedermannsdorf (AT)

(73) Assignee: Infineon Technologies AG, Munich (DE)

( * ) Notice: Subject to any disclaimer, the term of this patent is extended or adjusted under 35 U.S.C. 154(b) by 651 days.

(21) Appl. No.: 10/799,099

(22) Filed: Mar. 12, 2004

(65) Prior Publication Data

US 2004/0199858 A1    Oct. 7, 2004

(30) Foreign Application Priority Data

Mar. 12, 2003    (DE)    ................... 103 10 812

(51) Int. Cl.
*H03M 13/29*    (2006.01)
(52) U.S. Cl. .............. 714/755; 714/792; 714/794; 714/795
(58) Field of Classification Search ............. 714/755, 714/792, 794–795; *H03M 13/39*
See application file for complete search history.

(56) References Cited

U.S. PATENT DOCUMENTS

| | | | |
|---|---|---|---|
| 2002/0015401 A1* | 2/2002 | Subramanian et al. | ...... 370/347 |
| 2002/0119803 A1 | 8/2002 | Bitterlich et al. | |
| 2003/0026359 A1* | 2/2003 | Loeliger et al. | ............ 714/795 |
| 2003/0138030 A1* | 7/2003 | Gavnoudias et al. | ........ 375/141 |
| 2004/0174848 A1* | 9/2004 | Takayama et al. | .......... 370/335 |
| 2004/0243908 A1* | 12/2004 | Box et al. | .................... 714/759 |
| 2006/0003795 A1* | 1/2006 | Yamanaka et al. | ....... 455/550.1 |

FOREIGN PATENT DOCUMENTS

| | | |
|---|---|---|
| EP | 0 653 847 A2 | 5/1995 |
| WO | 02/21699 A2 | 3/2002 |

* cited by examiner

*Primary Examiner*—R. Stephen Dildine
(74) *Attorney, Agent, or Firm*—Laurence A. Greenberg; Werner H. Stemer; Ralph E. Locher

(57) ABSTRACT

A decoding apparatus includes at least one decoder both for a turbo-decoding and for a Viterbi decoding, at least one first data path for the Viterbi decoding of a convolution code, at least one second data path for the decoding of a turbo code, and a common memory having a multiplicity of individual memory areas. It is possible to allocate at least one memory area both through the first data path in the Viterbi mode and through the second data path in the turbo mode. The invention also includes a trellis processor and a method for operating a decoding apparatus in which at least parts of the first data path and of the second data path can be utilized jointly both for the turbo decoding and for the Viterbi decoding.

75 Claims, 3 Drawing Sheets

DECODING APPARATUS, TRELLIS PROCESSOR, AND METHOD FOR OPERATING THE DECODER

BACKGROUND OF THE INVENTION

Field of the Invention

The invention relates to a decoding apparatus having a decoder both for a turbo decoding and a Viterbi decoding, a trellis processor, and also a method for operating the decoding device.

In communication systems, for example, in mobile radio systems, the signal to be transmitted is subjected to a channel coding at the transmission end after being conditioned. The purpose of the channel coding is to add to the signal to be transmitted a redundancy that can be used to recover the signal after transmission through a disturbed channel as far as possible without any errors. In such a case, an effective error protection is realized by targeted introduction of redundancies into the signal to be transmitted.

Various coding/decoding methods exist for the coding and decoding of the signals to be transmitted:

Conventional Convolution Coders and Convolution Decoders (Viterbi Decoders)

In conventional convolution decoders a distinction is made between symbol estimators—which operate according to a symbolwise algorithm—and sequence estimators. A special form of a symbol estimator is a so-called Maximum A Posteriori (MAP) symbol estimator, which operates according to the so-called MAP algorithm. MAP symbol estimators have the advantage that they can realize a lowest possible bit error ratio.

An equalizer (or a rake receiver) supplies estimated values of the transmitted symbols or bits, which are supplied as soft input values (a sign bit plus a reliability information item) to the decoder. The soft input values, then, still contain a redundancy, from which the decoder attempts to recover the original non-coded values without redundancy. In such a case, hard decoding decision values may be supplied (hard outputs) which result from the bit sequence of the maximum likelihood path. Furthermore, soft decoding decision values (soft outputs), in which the bit sequence of the maximum likelihood path is related to other competing paths possibly present, may also be supplied. There are also soft decoding decision values that are obtained based upon a symbol estimator and correspondingly also take account of competing transitions.

Turbo Coders

A channel coding method that has only been developed and used in recent years uses binary, concatenated, recursive systematic convolution codes for which the designation "turbo code" has become established. In particular, when transmitting very large data blocks having more than 1000 bits (symbols), turbo coders can afford a considerably improved error protection compared with the convolution coders usually used.

For the decoding of such turbo codes, an iterative turbo code decoder—also referred to as turbo decoder hereinafter—is used at the receiver end. A turbo decoder includes a concatenation of at least two binary, recursive convolution decoders that are inter-leaved with one another in feedback-like fashion. The turbo decoder reverses the turbo coding and uses the redundancy values impressed on the systematic information in order to recover the systematic information after transmission through a disturbed propagation path as far as possible without any errors.

The precise construction and the precise functioning of a turbo decoder described above are described, for example, in the book—regarded as relevant prior art—by Peter Jung "Analyse und Entwurf digitaler Mobilfunksysteme" ["Analysis and Design of Digital Mobile Radio Systems"], Stuttgart, B. G. Täubner, 1997, in particular, on pages 343 to 368.

Turbo codes have the following advantages:
1. Turbo codes permit a very good transmission quality even for short data blocks and are, therefore, suitable in particular for voice transmission;
2. By turbo codes, a considerably improved error protection can be realized when transmitting very large volumes of data; and
3. Turbo codes are particularly suitable for those communication systems that have to provide many different services and applications flexibly, as is the case with digital cellular mobile radio systems.

However, turbo codes have the following disadvantages in comparison with conventional coders:
1. The decoding of turbo codes is much more complex than the decoding of conventional convolution codes, in which no recursive iteration steps are performed; and
2. In a turbo decoding method that configures the individual convolution decoders according to the (log)MAP principle (MAP=Maximum A Posteriori), the possibly time-variant amplitude of the reception signal and the possibly time-variant variants of the disturbance signal must be known absolutely, or be estimated with sufficient accuracy so that the desired transmission quality can be realized. Only a relative knowledge of these quantities is necessary for a MAX log MAP decoder, although this is accompanied by a loss of performance. The amplitudes and the variants of the additive white normally distributed interference must be known to the turbo decoder so that the desired decoding quality can be realized. This is not always possible in mobile radio due to the time variants of the mobile radio channel. However, if the amplitudes and the variants are not known precisely, the improvements in the decoding quality that can be achieved with turbo codes compared with conventional convolution codes are significantly reduced.

For the abovementioned reasons, a decoding apparatus in modern mobile radio systems should be able to decode both turbo codes and conventional convolution codes.

This problem has been solved heretofore by providing, for each different decoding, a decoder provided separately therefor. Each of these decoders has its own data path, in which the elements of the decoder are disposed, and a dedicated memory, which can be allocated in each case only by precisely this decoder. In addition to these elements, a respective decoder reveals a dedicated data input associated with it and typically also a dedicated data output. Finally, other functional elements of the decoder are also provided in each case separately from one another.

However, present-day and future mobile radio systems are subject to the requirements for integrating systems having ever greater functionality on an ever smaller space in order, thus, to provide a cost-effective system. This results from the fact that cost pressure, particularly in mobile radio systems, has, in the meantime, become the determining factor by which systems that are substantially functionally identical and identical in respect of quality differ from one another commercially. For this reason, it is counterproductive and increasingly no longer acceptable to provide a system in which undesirable redundancies arise to an extent by virtue of the fact that functionally identical units are present multiply for different data channels. Particularly in the case of very large volumes of data to be transmitted, it is particularly serious in the case of memories because these memories would, thus, have to be given very large dimensions. Such memories are, thus, the chip-area-determining factor on the semiconductor chip. Therefore, there is the need to utilize such chip-area-determining functional blocks at least partially jointly.

SUMMARY OF THE INVENTION

It is accordingly an object of the invention to provide a decoding apparatus, a trellis processor, and a method for operating the decoding device that overcome the hereinafore-mentioned disadvantages of the heretofore-known devices and methods of this general type and that is simplified in terms of circuitry.

With the foregoing and other objects in view, there is provided, in accordance with the invention:

A decoding apparatus having at least one decoder both for a turbo-decoding and for a Viterbi decoding, at least one first data path for the Viterbi decoding of a convolution code, and at least one second data path for the decoding of a turbo code, a common memory, which has a multiplicity of individual memory areas, it being possible to allocate at least one memory area both through the first data path in the Viterbi mode and through the second data path in the turbo mode;

A decoding apparatus having at least one decoder both for a turbo-decoding and for a Viterbi decoding, a first data path for the Viterbi decoding of a convolution code, and a second data path for the decoding of a turbo code, it being possible to utilize at least parts of the first data path and of the second data path jointly both for the turbo decoding and for the Viterbi decoding;

A trellis processor, in particular, for a decoding apparatus according to the invention, in which the trellis processor can be operated both in a Viterbi decoding mode for a convolution code and in a decoding mode for a turbo code, and the trellis processor, in the different operating modes, utilizes the data paths and also memory areas at least partially jointly;

A method for operating the decoding device, in which at least one first decoding is implemented using an exact Viterbi algorithm and/or at least one second decoding is implemented using the MAP algorithm or a turbo code; and A method for operating the decoding device, in which the traceback values of the entire trellis diagram are stored in a memory.

The idea on which the present invention is based lies in allowing all the different decoder functions to operate on a common local memory area. In addition, or as an alternative, at least a portion of the various decoder functions of the different operating modes are utilized jointly. The present invention is based on the insight that various decoder functions are redundant, that is to say, are doubly present in different decoding modes.

Furthermore, in the decoding device, there is always only one decoding mode active so that it is also necessary for only a single memory to be present for precisely the active decoding mode. The double or multiple provision of a respective memory for the various decoding operating modes can, thus, be dispensed with. It is necessary merely to ensure that the memory size is configured with respect to the maximum required memory size, typically for the memory size of the turbo decoding.

Moreover, a control device is provided, which is used to configure the memory space occupancy with respect to the various operating decoding modes. In particular, memory areas provided especially for the different decoder functions must, in this case, be assigned to the individual decoding modes. In addition to the use of a common memory for the decoding device, it is, thus, possible to jointly utilize hardware data paths that are present anyway, such as, for example, Add-Compare-Select (ACS) units and units for transition metric determination, both for turbo decoding and for Viterbi decoding, which has an effect on the reduction of the chip area in the case of a highly parallelized implementation.

In accordance with another feature of the invention, the common memory has a memory size configured with respect to a required memory size for turbo decoding.

In accordance with a further feature of the invention, the data path area of the decoder is formed in hardwired logic. However, a different refinement could also be conceivable, for example, an implementation of these elements in a program-controlled unit.

The first data path is configured for a Viterbi decoding and the second data path is configured for a turbo decoding.

In accordance with an added feature of the invention, the first data path may be configured for so-called hard output Viterbi algorithm (HDVA) decoding. In a particularly advantageous refinement, an exact hard output Viterbi algorithm is provided, no window-based decoding being performed, therefore, in the case of this algorithm. In a second refinement, the first data path may also be configured for soft output Viterbi algorithm (SOVA) decoding. SOVA and HDVA are, accordingly, to be understood as a special form of a Viterbi decoding.

In accordance with an additional feature of the invention, the second data path may be operated in a log MAP mode or in a MAX log MAP mode, as part of the turbo decoding. The MAP decoding mode includes a forward and backward recursion, symbolwise estimation being effective here. The MAP decoding mode is, thus, part of a turbo decoder that, between two MAP steps, additionally also carries out a turbo block inter-leaving or turbo block de-interleaving. A MAP, log MAP, and MAX log MAP are, accordingly, to be understood as a special form of a turbo code decoding.

The jointly utilized elements of the data paths of the decoding device may be, by way of example, ACS units or Branch Metric (BM) units, which serve for transition metric determination. The jointly utilized memory areas that are used both in the turbo decoding mode and in the Viterbi decoding mode may be, by way of example, memory areas for storing soft input data, transition metric data, and so-called log likelihood ratio data. Furthermore a different memory area division would also be conceivable, of course.

In accordance with yet another feature of the invention, a memory area of the common memory is configured for storing traceback values. In an advantageous development, the traceback values of the entire trellis diagram are stored there so that, in the case of a Blind Transport Format Detection (BTFD; with regard to BTFD, see 3GPP specification under 3GPP TS 25.212, "Multiplexing and channel coding", section 4.3, in particular, page 10), it is possible only to effect the traceback step from different start instants in the trellis diagram. A forward recursion with the determination of new state metrics needs only to be performed once.

In accordance with yet a further feature of the invention, a control device is provided that defines the operating mode of the decoder. Consequently, the memory device implements a memory division defined beforehand for a respective operating mode. The memory division is typically effected by a control signal fed from the control device to the respective memory. Furthermore, the control device defines the respective operating mode of the decoder. For such a purpose, the control device and/or the memory contain a multiplexer or have the functionality of a multiplexer. By such a multiplexer, the memory can be allocated the respective memory division in a manner dependent on the respective operating mode. Particularly, but not necessarily, the multiplexer is formed in hardwired logic and is part of the decoder.

In accordance with yet an added feature of the invention, there is provided a control device connected to at least one of the decoder and the memory, the control device being programmed to define an operating mode of the decoder and thereby control decoding through the first data path through the second data path.

In accordance with yet an additional feature of the invention, there is provided a control device connected to at least one of the decoder and the memory, the control device being programmed to define an operating mode of the decoder in which decoding through the first data path is effected through the second data path.

In accordance with yet an additional feature of the invention, the functionality of the multiplexer may also be implemented in the control device formed as a program-controlled unit. Such a program-controlled unit may be, by way of example, a microcontroller, a microprocessor, a signal processor, or the like.

In accordance with again another feature of the invention, the memory area occupancy of the memory is fixedly prescribed through the control device for a respective data path and, thus, for a respective operating mode.

In accordance with again a further feature of the invention, the decoding device according to the invention is formed at least partially, advantageously, even entirely, in hardware.

In accordance with again an added feature of the invention, the memory has at least one jointly utilized memory area and the jointly utilized memory area stores at least one of traceback values and state metrics.

In accordance with again an additional feature of the invention, the traceback values are of a trellis diagram and the traceback values of an entirety of the trellis diagram are stored in the jointly utilized memory area.

In accordance with still another feature of the invention, the memory has at least one jointly utilized log likelihood ratio data memory area for storing log likelihood ratio data from the turbo decoding.

In accordance with still a further feature of the invention, there is provide a control device connected to the decoded and being programmed to define an operating mode of the decoder and perform a memory division defined beforehand for a respective operating mode.

In accordance with still an added feature of the invention, the memory has a memory area occupancy fixedly prescribed for a respective one of the data paths through the control device.

In accordance with a concomitant feature of the invention, on account of the decoding device according to the invention, it is possible to implement an exact Viterbi algorithm that stores the so-called traceback information items of the entire trellis diagram without exceeding the limited memory size. The use of such an exact, i.e., not window-based Viterbi algorithm, has the following advantages:

Based on the maximum likelihood sequence, which is obtained with the aid of the conventional hard decision Viterbi algorithm, reliability information items—so-called soft output information items—can be obtained in a further path through the state diagram (trellis diagram). In contrast to the original, window-based, soft output Viterbi algorithm, it is necessary in this case only to update the reliability information items along the sole competing data path to the maximum likelihood data path. The competing path is determined anew for each unit of time in the trellis diagram.

In the Blind Transfer Format Detection (BTFD) operating mode, the currently transmitted transport format including transport block size and number of transport blocks is unknown to the receiver operated in the Viterbi mode. Rather, this has to be determined from a known set of possible transport formats by channel decoding with subsequent Cyclic Redundancy Check (CRC) coding. For the receiver operated in the Viterbi mode, this means that a feedback (traceback) with subsequent CRC decoding is carried out from a plurality of end positions in the trellis diagram. However, when using an exact Viterbi algorithm, this is, advantageously, particularly simple because the traceback information items about the entire state diagram are already stored. In particular, the determination of the maximum likelihood sequence after the determination of the correct transport format requires only a further "traceback" and no renewed decoding with metric accumulation. The conventional window-based, i.e., not exact, Viterbi decoding would in this case additionally also have to start a Viterbi pass (with metric accumulation) after the determination of the correct transport format because these traceback information items were stored only over a respective window.

Consequently, the method according to the invention requires significantly less time and, furthermore, also exhibits greater performance economy with regard to the system resources used than conventional methods.

Other features that are considered as characteristic for the invention are set forth in the appended claims.

Although the invention is illustrated and described herein as embodied in a decoding apparatus, trellis processor, and method for operating the decoder, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
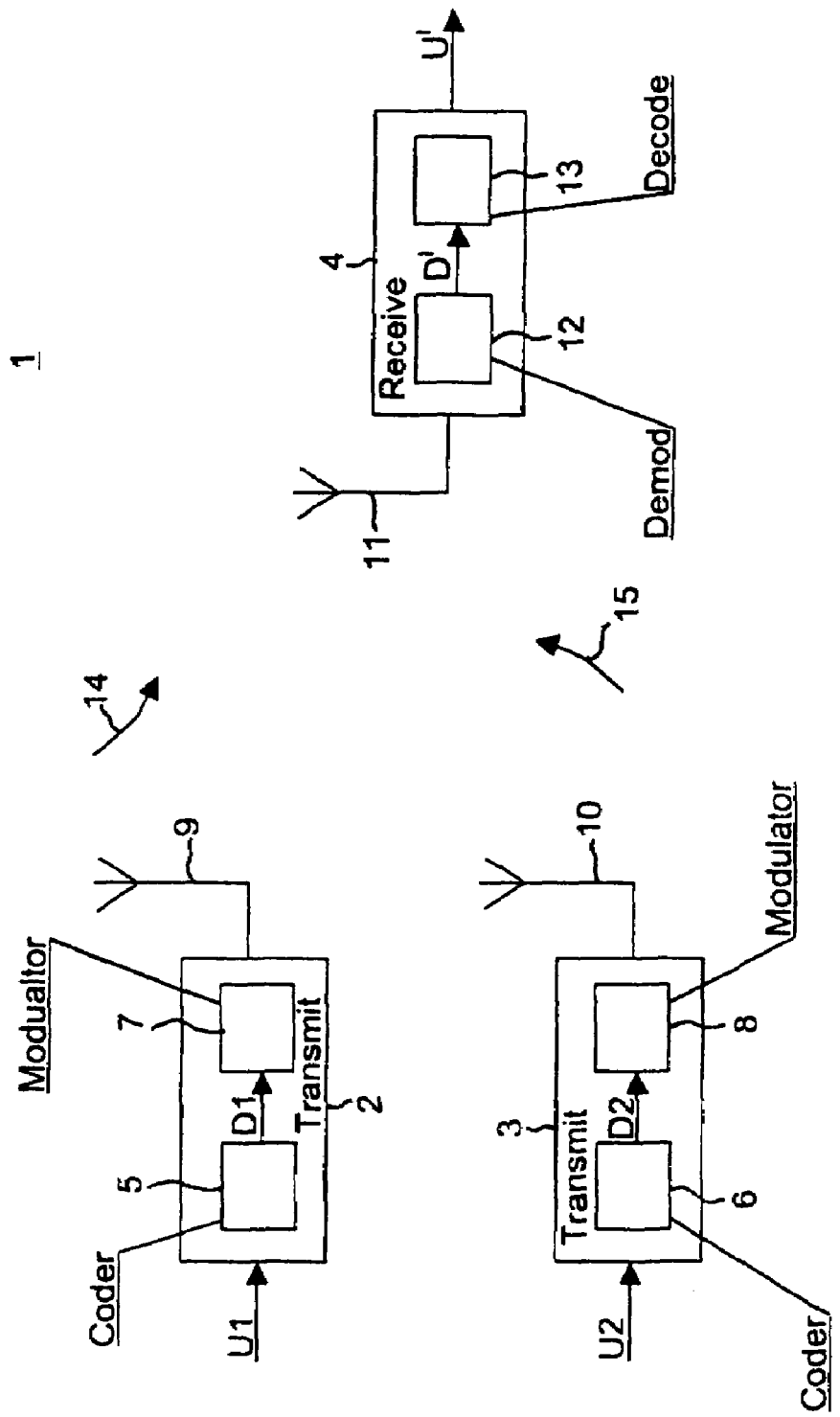
FIG. 1 is a block and schematic circuit diagram of an air interface of a mobile radio system according to the invention having two transmitters and one receiver.

In the figures of the drawing, unless specified otherwise, identical or functionally identical elements have been provided with the same reference symbols.

Referring now to the figures of the drawings in detail and first, particularly to FIG. 1 thereof, there is shown a schematic illustration of the air interface of a mobile radio system 1 according to the invention.

The mobile radio system 1 may be, by way of example, a Universal Mobile Tele-communications System (UMTS) or a Global System for Mobile Communications (GSM), but the invention shall not be restricted to such mobile radio systems. The mobile radio system 1 includes two transmitters 2, 3 and one receiver 4. The transmitters 2, 3 and the receiver 4 can be assigned both to a base station and to a mobile station. A respective transmitter 2, 3 has a coder 5, 6, a modulator 7, 8 and also a transmission antenna 9, 10. The receiver has a reception antenna 11, a demodulator 12, and a decoding device 13 according to the invention. Consequently, the two transmission channels 14, 15 are produced between the two transmitters 2, 3 and the receiver 4.

It shall be assumed in the present case that the coder 5 in the first transmitter 2 is a turbo coder that converts the input signal U1 into a turbo-coded output signal D1. It shall equally be assumed that the coder 6 in the second transmitter 3 is a conventional convolution coder that, by way of example, converts the input signal U2 into a convolution-coded output signal D2.

A respective coder 5, 6 receives a digital input signal U1, U2 in the form of a sequence of data symbols (bits). The input signal U1, U2 carries, by way of example, a voice message to be transmitted. The respective coder 5, 6 adds a redundancy for error protection coding to the digital input signal U1, U2. An error-protection-coded data signal D1, D2 is present at the output of the coder 5, 6 and, then, (in a manner that is not illustrated) is interleaved and subdivided into blocks having a predetermined length. A respective modulator 7, 8 modulates the data signal—error protection coded in this way—on to a carrier signal that (likewise in a manner that is not illustrated) is spectrally shaped by a transmission filter and amplified by a transmission amplifier before it is emitted as a radio signal through the respective antennas 9, 10. The reception antenna 11 receives the radio signal disturbed by ambient influences and interferences with radio signals in the transmission channel 14, 15 and feeds it to the demodulator 12. In the simplest case, the demodulator 12 at the receiver end includes a radiofrequency stage that receives the radio signal received through the reception antenna 11 and converts it in a customary manner by downconversion into an analog reception signal. The analog reception signal is digitized by an analog/digital converter (AD converter) with a sufficiently high sampling frequency and, if appropriate, bandwidth-limited by a digital filter connected downstream. The demodulator 12 equalizes the received radio signal taking account of the signal disturbances incurred in the radio channel.

The equalized data signal D' present at the output of the demodulator 12 is present in the form of a symbol sequence whose elements are value-continuous estimated values of the symbols of the transmitted error-protection-coded data signal. The equalized data signal D' is fed to the decoding device 13 according to the invention. A decoded output signal U' is present at the output of the decoding device 13. In addition, it is also possible, in the channel decoder 13, to generate a reliability information item and to utilize it in an advantageous manner during the source decoding.

The construction and the functioning of a mobile radio system illustrated in FIG. 1 are described in the book by Peter Jung, "Analyse und Entwurf digitaler Mobilfunksysteme" ["Analysis and Design of Digital Mobile Radio Systems"], in particular in FIG. 4.24 therein. The entire contents of this document, in particular, with regard to the construction and the functioning of the coders used, the decoders, and, also, the transmission channel are concomitantly incorporated into the present patent application by reference in its entirety.

Figure 2:
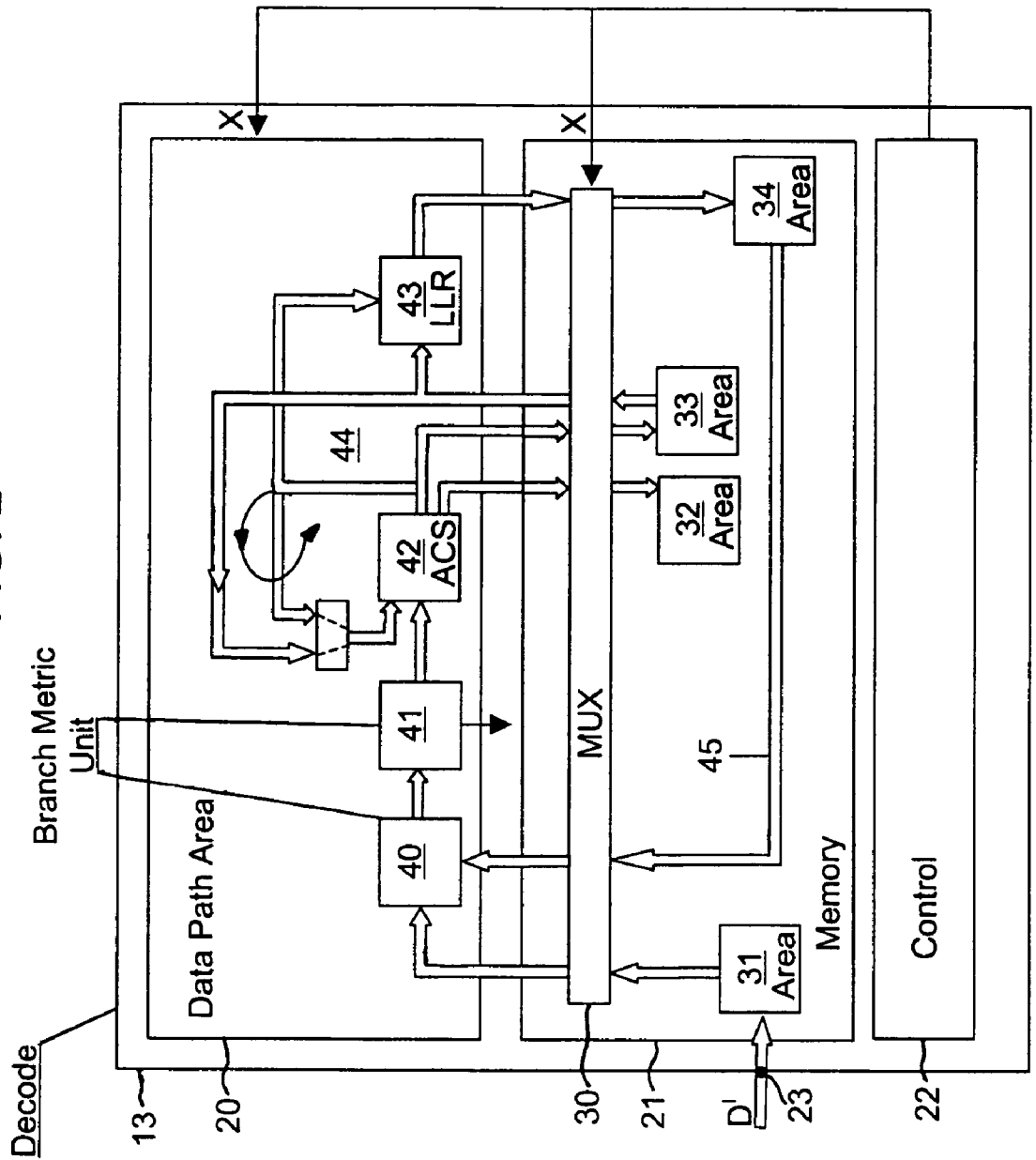
FIG. 2 is a block circuit diagram of a decoding device according to the invention disposed in a receiver of FIG. 1.

The construction and the functioning of a decoding device 13 according to the invention will be explained in greater detail below with reference to FIGS. 2 and 3. FIG. 2 shows the block diagram of a decoding device according to the invention that is disposed in the receiver from FIG. 1.

The decoding device 13 according to the invention has a data path area 20, a memory device 21, and a control device 22. The decoder 13, furthermore, has an input 23, through which so-called soft input signals D' of the demodulator 12 connected upstream can be coupled. The output or the outputs of the decoding device 13 have not been illustrated in FIG. 2 for the sake of clarity.

The memory device 21 has a multiplexer circuit 30, which is provided to an extent as an interface between the memory device 21, on one hand, and the data path area 20, the input 23, and the output of the decoding device 13, on the other hand. The memory device 21, furthermore, has different memory areas 31, 32, 33, 34, which can be allocated through the data path area 20 or the input 23.

In the present exemplary embodiment, the memory area 31 is configured for buffer-storing soft input data D' from the demodulator 12 connected upstream. The memory area 32 is a so-called traceback memory. The memory area 32 has stored in it for each state of each unit of time the decision results during an ACS step (that is to say, the pointer to the most favorable transition to the relevant state of the present unit of time) so that after a pass of the entire trellis diagram, with the aid of these decision results, it is possible to determine the maximum likelihood path through the so-called traceback step. The state metrics calculated in the context of the decoding are stored in the memory area 33. The memory area 34 is a so-called Log Likelihood Ratio (LLR) memory, in which are stored, by way of example, a priori data or reliability data obtained in the context of the turbo code decoding. Furthermore, the memory device 21 may, additionally or alternatively, contain even further memory areas in which, by way of example, data are stored for input and output buffering in which information items obtained in the context of the various decoding methods are stored specifically in each case for the respective decoding method. Memory areas for the possible transition metrics determined within a unit of time likewise have to be taken into account, but are not presented here.

The control device 22 can control the respective memory division and, thus, the operating mode of the decoding device 13. In the present case, a specific memory occupancy is preset by the control signal X, which is coupled into the multiplexer device 30 from the control device 22. Such memory occupancy may be specifically chosen, for example, with regard to a turbo decoding or an SOVA decoding.

In the present exemplary embodiment, the multiplexer device 30 is part of the memory device 21 and is, thus, present in hardwired control logic.

The control device 22 is, preferably, a program-controlled unit, for example, a microcontroller, microprocessor, signal processor, or the like. In an alternative refinement, the functionality of the multiplexer 30 could be concomitantly integrated in the control device 21. As an alternative, however, it would also be conceivable for the functionality of the control device 21 to be present in hardwired control logic.

A so-called branch metric unit 40, 41 is disposed in the data path area 20 of the decoding device 13. The branch metric unit 40, 41 is coupled to the input 23 for coupling in input data through the soft input memory area 31. The branch metric unit 40, 41 contains a unit 40 for calculating the branch metric data, downstream of which is connected a unit 41 for selecting the branch metric data. The branch metric units 40, 41 are, thus, units for transition metric determination for the turbo code and Viterbi code decoding in which the metrics are calculated per trellis time unit, a metric in each case being mapped on to the ACS unit 42 connected downstream. An assignment of the selected data is, thus, effected here.

A so-called ACS unit 42 Add-Compare-Select (ACS) is connected downstream of the branch metric units 40, 41. The ACS unit 42 implements the calculation of the optimum path between two states with the aid of a trellis diagram in which, in each case for each node of the trellis diagram, data are added and compared with one another and, then, the optimum path is selected. The ACS unit 42 restores the pointer to the optimum transition to the considered state of the present unit of time (that is to say, the result of the addition and comparison operations of the ACS unit 42) in the form of traceback data for all the states and all the trellis time units in the memory area 32. The state metrics determined during the ACS operation are stored in the memory area 33 and can be overwritten with new values from unit of time to unit of time.

It should be noted that the ACS unit would have to be slightly modified for the operation of a decoding apparatus in the log MAP mode. However, such a modification is sufficiently known to the person skilled in the art (see Steven S. Pietrobon, "Implementation and performance of a Turbo/MAP decoder", International Journal of Satellite Communications, Issue 16, pages 23-46, 1998). For a calculation of the new state metrics, the conventional ACS unit is equipped with a further addition of a value that results as a special function of the calculated difference from the comparison operation (compare). This special function is usually implemented as a lookup table. If the lookup table has zeros pre-assigned to it, the result is the normal ACS functionality as is required for the MAX log MAP, HDVA, or SOVA mode.

A so-called LLR unit 43 is disposed in a manner connected downstream of the ACS unit 42. In the LLR unit 43, estimated data are calculated based upon the log likelihood ratio method. The LLR unit calculates reliability information items that are stored in the memory area 34 and are fed back as required through the turbo feedback path 45. The ACS unit 42 is coupled to the LLR unit 43 through the iteration network 44 for forward and backward recursion.

On the output side, the LLR unit 43 is coupled to the LLR memory area 34, in which the corresponding data calculated by the LLR unit 43 are stored. A turbo feedback loop 45 is also provided, through which soft data stored in the LLR memory area 34 are fed back into the branch metric unit 40.

On the output side, the ACS unit 42 is connected through the iteration network 44 both to the traceback memory area 32 and to the state metric memory area 33, in which data (metric values of the individual states in the trellis) calculated by the ACS unit 42 can, thus, be stored. The state metric memory area 33 is, furthermore, coupled through the iteration network 44 to the input of the ACS unit 42 so that the already calculated and stored data (state metrics) are, once again, used here in the subsequent step for the next unit of time in the trellis diagram. In the conventional Viterbi algorithm, the use of already calculated state metrics of the previous unit of time in the trellis describes the forward recursion. In the turbo or, also, the MAP decoder, the reuse of the already calculated state metrics is carried out in the forward recursion and in the backward recursion. The function of the forward and backward recursion within the iteration network 45, which plays a particular part, particularly in the case of turbo code decoding, is generally known to the person skilled in the art and, therefore, is not explained in detail below (in this respect, see the book cited above by Peter Jung).

The decoding device 13, according to the invention, is configured both for the decoding of turbo-coded data and for the conventional decoding by the Viterbi algorithm. The following two data paths, thus, result within the data path area 20:

First Data Path for the Turbo Code

In the case of a turbo coding, incoming data to be decoded are, first, stored in the soft input memory area 31 through the input 23. In addition, or as an alternative, incoming data to be decoded (channel soft inputs) could also be processed directly, as it were "on the fly", so that the soft input data would not have to be buffer-stored at all for these applications (for example, for hard-decision Viterbi without subsequent BTFD application).

These data stored in the memory 31 are read out as required from the soft input memory area 31 and coupled into the data path area 20. The turbo code data path within the data path area 20, thus, results from the branch metric units 40, 41, the ACS unit 42, the iteration network 44, and the LLR unit 43. Such a data path, furthermore, includes the state metric memory unit 33, the LLR memory unit 34 connected downstream of the LLR unit 43, and the feedback turbo loop 45.

Second Data Path for Viterbi Decoding

In addition to the input 23 and the soft input memory area 31, the data path for Viterbi decoding likewise includes the branch metric units 40, 41 and the ACS unit 42 connected downstream thereof. Furthermore, the Viterbi data path contains parts of the iteration network 44 through which the data are stored in the memory areas 32, 33 or are, again, introduced into the data path (data of the memory area 33), in particular, into the ACS unit.

Figure 3A:
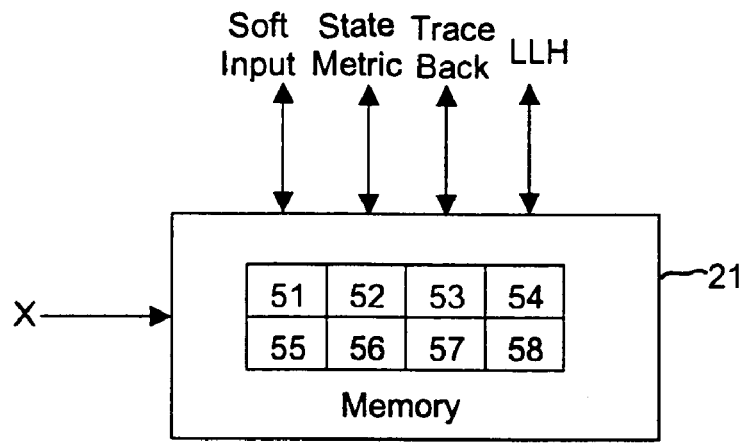
FIG. 3A is a diagrammatic illustration of a memory—divided into different memory areas—for a decoding device of FIG. 2.

FIG. 3A is a schematic illustration of a memory device 21 according to the invention, which is subdivided into eight memory segments in the present case. The eight segments of the memory device 21 have been designated by reference symbols 51 through 58. An operating mode of the memory device 21 can be preset by the control signal X provided by the control device 22.

Only two operating modes shall be assumed in the present case: in the first operating mode, coupled-in data are stored by a turbo decoding, while in the second operating mode a Viterbi algorithm is provided for this purpose. However, the invention shall not be considered restricted to just these two decoding modes but, rather, can also be extended to other decoding modes or more than two decoding modes.

Figure 3B:
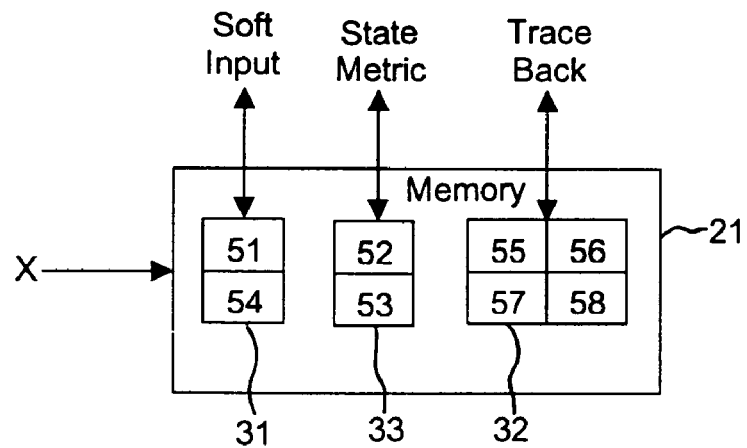
FIG. 3B is a diagrammatic illustration of a memory—divided into different memory areas—for a decoding device of FIG. 2 performing a Viterbi decoding.

The memory device 21 is connected through bidirectional data lines to the input 23 and to the corresponding elements 40, 42, 43, 44 in the data path area 20 of the decoding device 13, which elements have not been illustrated in FIG. 3A for the sake of clarity. A more detailed explanation is given below of the different memory division of the memory segments 51 to 58 in the case of the Viterbi decoding mode (FIG. 3B) and in the case of the turbo decoding mode (FIG. 3C):

Viterbi Mode (FIG. 3B)

In the Viterbi mode, soft input data are stored in the memory segments 51, 54, which, thus, form the memory area 31. State metric data are in this case stored in the memory segments 52, 53, which form the memory area 33. In the Viterbi decoding mode, traceback data are, furthermore, stored in the memory segments 55 to 58, which form the memory area 32.

Consequently, an LLR memory area 34 is not provided in the hard-decision Viterbi decoding mode.

Figure 3C:
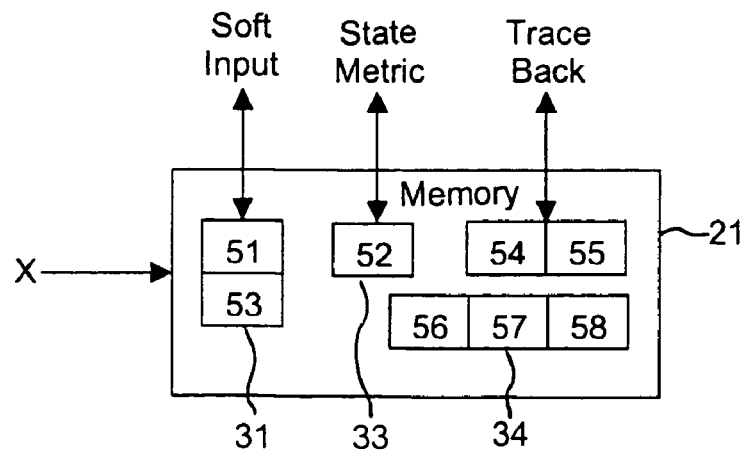
FIG. 3C is a diagrammatic illustration of a memory—divided into different memory areas—for a decoding device of FIG. 2 performing a turbo code decoding.

Turbo Mode (FIG. 3C)

In the turbo mode, soft input data are stored in the memory segments 51, 53 through the input 23. These memory segments 51, 53 form the memory area 31. State metric data are stored in the memory segment 52, which forms the memory area 33. LLR data are stored in the memory segments 54 through 58, which form the memory area 34. Consequently, a traceback memory area 32 is not provided in the turbo-decoding mode.

The memory space segmentation specified in FIGS. 3A to 3C is described herein merely by way of example, but may, of course, also be formed in an arbitrary other way.

In FIGS. 3B and 3C, it is noticeable that the memory segments 51, 52 are utilized in a functionally identical manner both in the Viterbi mode and in the turbo mode. It becomes clear from this that, in particular, the branch metric unit 40, 41, the ACS unit 42, and parts of the iteration network 44 in the data path area 20 are used jointly both in the turbo decoding mode and in the Viterbi decoding mode.

FIGS. 3B and 3C furthermore show that, although individual memory areas 31, 33 are utilized jointly within the memory device 21, the size thereof need not necessarily be of the same magnitude both in the turbo decoding mode and in the Viterbi decoding mode. Rather, the individual memory areas may be configured with different sizes for the different decoding modes.

Furthermore, the remaining memory segments are also utilized jointly in both decoding modes. This is defined by a memory occupancy in each case specific to the operating mode chosen. As such, the resources of the memory 21 can be utilized optimally by configuring the memory for the maximum required memory space requirement of one of the operating modes used. The one or more other decoding operating modes require a smaller memory space requirement, which is, thus, always present.

Typically, but not necessarily, the turbo-decoding mode is the determining factor with regard to the memory space requirement so that the configuration of the memory size of the memory device 21 usually has to proceed from the memory space requirement in the turbo-decoding mode. A typical numerical example is given below to explain this memory space saving in comparison with a conventional decoder configured both for Viterbi and turbo code decoding.

Without the decoding apparatus 13 according to the invention, the following memory resources are required (assuming 6 bits for the soft input resolution and UMTS-specific coders and assuming a window-length for Viterbi/SOVA=5*constraint length):

159,000 bits Turbo mode
21,000 bits Window-based Viterbi mode
138,000 bits SOVA based on window-based Viterbi
318,000 bits Total Because, by the method according to the invention and the decoding device according to the invention, the memory only has to be configured with respect to the largest number of bits, but not with respect to the sum of the number of bits, the result is a memory size according to the invention of 159,000 bits. Thus, in the example illustrated, the memory can be smaller approximately by a factor of ½.

The above description of the invention has illustrated the decoding device according to the invention based upon a mobile radio system. However, the invention shall not be restricted thereto but, rather, can be used very advantageously in all systems with coding and decoding devices.

The invention shall not be restricted to a conventional Viterbi decoding or a conventional turbo decoding, but, rather, can be extended to all decoding types, of whatever design, which decode data based upon a maximum likelihood (ML) log MAP–MAX log MAP algorithm. Such decoding or trellis processor modes are, by way of example, in addition to the conventional Viterbi decoding mode and turbo decoding mode, also the following decoding modes as already mentioned: HOVA, SOVA, Log MAP, MAX log MAP. The last three decoding modes can be used both for the soft output decoding of conventional, non-concatenated convolution codes and for the decoding of parallel-concatenated convolution codes (i.e., traditional turbo codes) or, else, of serially concatenated convolution codes. Furthermore, an application to an ML, MAP, Log MAP, or MAX log MAP equalization or, else, iterative turbo equalization is conceivable and possible.

To summarize, it may be stated that the invention provides a decoding device that can be operated both in the turbo decoding mode and in the Viterbi decoding mode and in which memory space resources and system resources can be saved through joint utilization in both operating modes in a very elegant yet, nevertheless, simple manner.

The present invention has been explained based upon the above description to clarify the principle of the invention and the practical application thereof in the best way possible, but the invention, given suitable modification, can, of course, be realized in manifold other embodiments.

This application claims the priority, under 35 U.S.C. § 119, of German patent application No. 103 10 812.2, filed Mar. 12, 2003; the entire disclosure of this priority application is herewith incorporated by reference.

We claim:

1. A decoding apparatus, comprising:
at least one turbo-decoding and Viterbi-decoding decoder having:
at least one first Viterbi-decoding data path for Viterbi decoding of a convolution code; and
at least one second turbo-code data path for decoding of a turbo code; and
a common memory connected to said decoder and having a multiplicity of individual memory areas, at least one of said memory areas being allocated through said first Viterbi-decoding data path in a Viterbi mode and through said second turbo-code data path in a turbo mode.

2. The decoding apparatus according to claim 1, wherein said common memory has a memory size configured with respect to a required memory size for turbo decoding.

3. The decoding apparatus according to claim 1, wherein said decoder has data paths formed in hardwired logic.

4. The decoding apparatus according to claim 1, wherein said first, data path is a hard output Viterbi algorithm decoding data path.

5. The decoding apparatus according to claim 1, wherein said first data path is an exact hard output Viterbi algorithm decoding data path.

6. The decoding apparatus according to claim 1, wherein said first data path is a soft output Viterbi algorithm decoding data path configured to soft output Viterbi algorithm decode.

7. The decoding apparatus according to claim 1, wherein said second data path is a log MAP mode data path operated in a log MAP mode as part of the turbo code decoding.

8. The decoding apparatus according to claim 1, wherein said second data path is a MAX log MAP mode data path operated in a MAX log MAP mode as part of the turbo code decoding.

9. The decoding apparatus according to claim 1, wherein said first and second data paths have at least one jointly utilized element and said jointly utilized element is an ACS unit.

10. The decoding apparatus according to claim 1, wherein:
    wherein said first and second data paths have jointly utilized elements; and
    at least one of said jointly utilized elements is a branch metric unit for transition metric determination.

11. The decoding apparatus according to claim 1, wherein said memory has at least one jointly utilized soft input data memory area for storing soft input data.

12. The decoding apparatus according to claim 1, wherein:
    said first and second data paths have jointly utilized elements; and
    at least one of said jointly utilized elements is a branch metric unit for transition metric determination.

13. The decoding apparatus according to claim 1, wherein said memory has at least one jointly utilized memory area and said jointly utilized memory area stores at least one of traceback values and state metrics.

14. The decoding apparatus according to claim 13, wherein said traceback values are of a trellis diagram and said traceback values of an entirety of said trellis diagram are stored in said jointly utilized memory area.

15. The decoding apparatus according to claim 1, wherein said memory has at least one jointly utilized log likelihood ratio data memory area for storing log likelihood ratio data from the turbo decoding.

16. The decoding apparatus according to claim 1, further comprising a control device connected to at least one of said decoder and said memory, said control device being programmed to define an operating mode of the decoder and thereby control decoding through said first data path through said second data path.

17. The decoding apparatus according to claim 1, further comprising a control device connected to at least one of said decoder and said memory, said control device being programmed to define an operating mode of the decoder in which decoding through said first data path is effected through said second data path.

18. The decoding apparatus according to claim 17, wherein said memory has a memory area occupancy fixedly prescribed for a respective one of said data paths through said control device.

19. The decoding apparatus according to claim 17, wherein at least one of said control device and said memory one of:
    has a multiplexer; and
    performs the functionality of a multiplexer.

20. The decoding apparatus according to claim 19, wherein at least one of said multiplexer and said control device are formed in hardwired logic and are part of the decoder.

21. The decoding apparatus according to claim 17, wherein said control device has a program-controlled unit having a multiplexer functionality.

22. The decoding apparatus according to claim 21, wherein said program-controlled unit is one of a microcontroller and a microprocessor.

23. The decoding apparatus according to claim 1, further comprising a control device connected to said decoded and being programmed to:
    define an operating mode of said decoder; and
    perform a memory division defined beforehand for a respective operating mode.

24. The decoding apparatus according to claim 23, wherein said memory has a memory area occupancy fixedly prescribed for a respective one of said data paths through said control device.

25. The decoding apparatus according to claim 23, wherein said control device has a program-controlled unit having a multiplexer functionality.

26. The decoding apparatus according to claim 25, wherein said program-controlled unit is one of a microcontroller and a microprocessor.

27. The decoding apparatus according to claim 23, wherein at least one of said control device and said memory one of:
    has a multiplexer; and
    performs the functionality of a multiplexer.

28. The decoding apparatus according to claim 27, wherein at least one of said multiplexer and said control device are formed in hardwired logic and are part of the decoder.

29. The decoding apparatus according to claim 1, wherein said decoder is at least partially formed in hardware.

30. The decoding apparatus according to claim 1, wherein said decoder is at entirely formed in hardware.

31. The decoding apparatus according to claim 1, further comprising a trellis processor programmed to:
    operate both in a Viterbi decoding mode for a convolution code and in a decoding mode for a turbo code; and
    utilize said first and second data paths and areas of said memory at least partially jointly in the Viterbi decoding mode and the turbo code decoding mode.

32. A method for operating a decoder, which comprises:
    providing the decoding apparatus according to claim 1; and implementing:
    at least one first decoding utilizing an exact Viterbi algorithm; and
    at least one second decoding utilizing one of a MAP algorithm and a turbo code.

33. A method for operating a decoder, which comprises:
    providing the decoding apparatus according to claim 1;
    providing a trellis diagram with traceback values; and
    storing the traceback values of an entirety of the trellis diagram in the memory.

34. A decoding apparatus, comprising:
at least one turbo-decoding and Viterbi-decoding decoder having:
a first data path for Viterbi decoding a convolution code; and
a second data path for turbo-code decoding of a turbo code; and
said first data path and said second data path having at least one common portion decoding data both in a turbo-code decoding mode and in a Viterbi decoding mode.

35. The decoding apparatus according to claim 34, wherein said first data path is a hard output Viterbi algorithm decoding data path.

36. The decoding apparatus according to claim 34, wherein said first data path is an exact hard output Viterbi algorithm decoding data path.

37. The decoding apparatus according to claim 34, wherein said first data path is a soft output Viterbi algorithm decoding data path configured to soft output Viterbi algorithm decode.

38. The decoding apparatus according to claim 34, wherein said second data path is a log MAP mode data path operated in a log MAP mode as part of the turbo code decoding.

39. The decoding apparatus according to claim 34, wherein said second data path is a MAX log MAP mode data path operated in a MAX log MAP mode as part of the turbo code decoding.

40. The decoding apparatus according to claim 34, wherein said first and second data paths have at least one jointly utilized element and said jointly utilized element is an ACS unit.

41. The decoding apparatus according to claim 34, wherein:
wherein said first and second data paths have jointly utilized elements; and
at least one of said jointly utilized elements is a branch metric unit for transition metric determination.

42. The decoding apparatus according to claim 34, wherein said decoder has data paths formed in hardwired logic.

43. The decoding apparatus according to claim 34, wherein:
said first and second data paths have jointly utilized elements; and
at least one of said jointly utilized elements is a branch metric unit for transition metric determination.

44. The decoding apparatus according to claim 34, further comprising a common memory connected to said decoder and having a multiplicity of individual memory areas, at least one of said memory areas being allocated through said first Viterbi-decoding data path in the Viterbi mode and through said second turbo-code data path in the turbo mode.

45. The decoding apparatus according to claim 44, wherein said common memory has a memory size configured with respect to a required memory size for turbo decoding.

46. The decoding apparatus according to claim 44, wherein said memory has at least one jointly utilized soft input data memory area for storing soft input data.

47. The decoding apparatus according to claim 44, further comprising a trellis processor programmed to:
operate both in a Viterbi decoding mode for a convolution code and in a decoding mode for a turbo code; and
utilize said first and second data paths and areas of said memory at least partially jointly in the Viterbi decoding mode and the turbo code decoding mode.

48. The decoding apparatus according to claim 44, further comprising a control device connected to at least one of said decoder and said memory, said control device being programmed to define an operating mode of the decoder in which decoding through said first data path is effected through said second data path.

49. The decoding apparatus according to claim 48, wherein at least one of said control device and said memory one of:
has a multiplexer; and
performs the functionality of a multiplexer.

50. The decoding apparatus according to claim 49, wherein at least one of said multiplexer and said control device are formed in hardwired logic and are part of the decoder.

51. The decoding apparatus according to claim 48, wherein said memory has a memory area occupancy fixedly prescribed for a respective one of said data paths through said control device.

52. The decoding apparatus according to claim 48, wherein said control device has a program-controlled unit having a multiplexer functionality.

53. The decoding apparatus according to claim 52, wherein said program-controlled unit is one of a microcontroller and a microprocessor.

54. The decoding apparatus according to claim 44, wherein said memory has at least one jointly utilized memory area and said jointly utilized memory area stores at least one of traceback values and state metrics.

55. The decoding apparatus according to claim 54, wherein said traceback values are of a trellis diagram and said traceback values of an entirety of said trellis diagram are stored in said jointly utilized memory area.

56. The decoding apparatus according to claim 44, further comprising a control device connected to said decoded and being programmed to:
define an operating mode of said decoder; and
perform a memory division defined beforehand for a respective operating mode.

57. The decoding apparatus according to claim 56, wherein at least one of said control device and said memory one of:
has a multiplexer; and
performs the functionality of a multiplexer.

58. The decoding apparatus according to claim 57, wherein at least one of said multiplexer and said control device are formed in hardwired logic and are part of the decoder.

59. The decoding apparatus according to claim 56, wherein said memory has a memory area occupancy fixedly prescribed for a respective one of said data paths through said control device.

60. The decoding apparatus according to claim 56, wherein said control device has a program-controlled unit having a multiplexer functionality.

61. The decoding apparatus according to claim 60, wherein said program-controlled unit is one of a microcontroller and a microprocessor.

62. The decoding apparatus according to claim 44, wherein said memory has at least one jointly utilized log likelihood ratio data memory area for storing log likelihood ratio data from the turbo decoding.

63. The decoding apparatus according to claim 44, further comprising a control device connected to at least one of said decoder and said memory, said control device being programmed to define an operating mode of the decoder and thereby control decoding through said first data path through said second data path.

64. The decoding apparatus according to claim 34, wherein said decoder is at least partially formed in hardware.

65. The decoding apparatus according to claim 34, wherein said decoder is at entirely formed in hardware.

66. A method for operating a decoder, which comprises:
providing the decoding apparatus according to claim 34; and
implementing:
at least one first decoding utilizing an exact Viterbi algorithm; and
at least one second decoding utilizing one of a MAP algorithm and a turbo code.

67. A method for operating a decoder, which comprises:
providing the decoding apparatus according to claim 34;
providing a trellis diagram with traceback values; and
storing the traceback values of an entirety of the trellis diagram in the memory.

68. A decoding apparatus, comprising:
at least one decoder configured to decode both by turbo-decoding and by Viterbi-decoding, said decoder having:
at least one first Viterbi-decoding data path for Viterbi decoding of a convolution code; and
at least one second turbo-code data path for decoding of a turbo code; and
a common memory connected to said decoder and having a multiplicity of individual memory areas, at least one of said memory areas being allocated through said first Viterbi-decoding data path in a Viterbi mode and through said second turbo-code data path in a turbo mode.

69. The decoding apparatus according to claim 68, further comprising a trellis processor programmed to:
operate both in a Viterbi decoding mode for a convolution code and in a decoding mode for a turbo code; and
utilize said first and second data paths and areas of said memory at least partially jointly in the Viterbi decoding mode and the turbo code decoding mode.

70. A method for operating a decoder, which comprises:
providing the decoding apparatus according to claim 68; and
implementing:
at least one first decoding utilizing an exact Viterbi algorithm; and
at least one second decoding utilizing one of a MAP algorithm and a turbo code.

71. A method for operating a decoder, which comprises:
providing the decoding apparatus according to claim 68;
providing a trellis diagram with traceback values; and
storing the traceback values of an entirety of the trellis diagram in the memory.

72. A decoding apparatus, comprising:
at least one turbo-decoding and Viterbi-decoding decoder having:
a first data path for Viterbi decoding a convolution code; and
a second data path for turbo-code decoding of a turbo code; and
at least parts of said first data path and of said second data path being jointly utilized both for the turbo-code decoding and for the Viterbi decoding.

73. The decoding apparatus according to claim 72, further comprising:
a common memory connected to said decoder and having a multiplicity of individual memory areas, at least one of said memory areas being allocated through said first Viterbi-decoding data path in the Viterbi mode and through said second turbo-code data path in the turbo mode; and
a trellis processor programmed to:
operate both in a Viterbi decoding mode for a convolution code and in a decoding mode for a turbo code; and
utilize said first and second data paths and areas of said memory at least partially jointly in the Viterbi decoding mode and the turbo code decoding mode.

74. A method for operating a decoder, which comprises:
providing the decoding apparatus according to claim 34; and
implementing:
at least one first decoding utilizing an exact Viterbi algorithm; and
at least one second decoding utilizing one of a MAP algorithm and a turbo code.

75. A method for operating a decoder, which comprises:
providing the decoding apparatus according to claim 72,
providing a trellis diagram with traceback values; and
storing the traceback values of an entirety of the trellis diagram in the memory.

\* \* \* \* \*